(12) United States Patent
Kim et al.

(10) Patent No.: US 8,990,535 B2
(45) Date of Patent: Mar. 24, 2015

(54) METHOD FOR OPERATING MEMORY CONTROLLER, AND MEMORY SYSTEM INCLUDING THE SAME

(75) Inventors: Hyun Seok Kim, Goyang-si (KR); Sung Bin Kim, Seoul (KR); Sung-Hwan Bae, Seoul (KR); Jong-Nam Baek, Hwaseong-si (KR); Sang Hoon Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 346 days.

(21) Appl. No.: 13/564,076

(22) Filed: Aug. 1, 2012

(65) Prior Publication Data
US 2013/0036261 A1 Feb. 7, 2013

(30) Foreign Application Priority Data

Aug. 4, 2011 (KR) ........................ 10-2011-0077748

(51) Int. Cl.
*G06F 12/00* (2006.01)
*G06F 13/16* (2006.01)
*G06F 11/00* (2006.01)
*G06F 11/10* (2006.01)
*G11C 16/26* (2006.01)
*G11C 16/34* (2006.01)

(52) U.S. Cl.
CPC ............... *G06F 13/16* (2013.01); *G06F 11/00* (2013.01); *G06F 11/1048* (2013.01); *G11C 16/26* (2013.01); *G11C 16/349* (2013.01)
USPC .......................................... 711/167; 711/103

(58) Field of Classification Search
None
See application file for complete search history.

(56) References Cited

U.S. PATENT DOCUMENTS

| 6,167,482 | A | 12/2000 | Schmidt et al. |
| 7,770,079 | B2 | 8/2010 | Radke et al. |
| 2010/0322007 | A1* | 12/2010 | Jeon .......................... 365/185.18 |
| 2011/0066899 | A1* | 3/2011 | Kang et al. ..................... 714/54 |
| 2012/0239991 | A1* | 9/2012 | Melik-Martirosian ....... 714/708 |

FOREIGN PATENT DOCUMENTS

| JP | 10-254590 A | 9/1998 |
| JP | 11-085571 A | 3/1999 |
| KR | 2010-0046265 A | 5/2010 |

* cited by examiner

*Primary Examiner* — Gary Portka
(74) *Attorney, Agent, or Firm* — Harness, Dickey & Pierce, P.L.C.

(57) ABSTRACT

A method for operating a memory controller capable of controlling a maximum count of a read retry operation is disclosed. The method includes programming a first real time clock (RTC) value indicating a time-of-day when a program operation is performed when the program operation for programming a data to a storage region of a non-volatile memory, obtaining information for the storage region by using the first RTC value read from the non-volatile memory and a second RTC value indicating a time-of-day when a read operation is performed, when the read operation for the data programmed to the storage region is performed, and decreasing a maximum count of a read retry operation by using the information, when the read retry operation is performed for the storage region.

20 Claims, 13 Drawing Sheets

FIG. 5

| Di=C3−C2 | Vth Change | Maximum # of Read Retry |
|---|---|---|
| D1 | Vth1 | R1 |
| D2(D2>D1) | Vth2(Vth2>Vth1) | R2(R2<R1) |
| D3(D3>D2) | Vth3(Vth3>Vth2) | R3(R3<R2) |
| ... | ... | ... |
| Dn | Vthn | Rn |

METHOD FOR OPERATING MEMORY CONTROLLER, AND MEMORY SYSTEM INCLUDING THE SAME

CROSS-REFERENCE TO RELATED APPLICATIONS

This application claims priority under 35 U.S.C. §119(a) to Korean Patent Application No. 10-2011-0077748 filed on Aug. 4, 2011, the entire contents of which are hereby incorporated by reference.

BACKGROUND

1. Field

At least one example embodiment relates to a method for operating a memory controller and/or memory system.

2. Related Art

A memory is classified a volatile memory retaining data stored to the memory only while power is being provided thereto and a non-volatile memory retaining data stored to the memory even if power is cut off.

The volatile memory includes dynamic random access memory (DRAM), and the non-volatile memory includes read only memory (ROM), flash memory, and resistive memory. The flash memory includes NAND flash memory and NOR flash memory.

As the manufacturing process of NAND flash memory becomes refined, the lifespan of the NAND flash memory becomes shorter, and read errors during the read operation reading data stored to the NAND flash memory increases gradually.

The NAND flash memory performs the read retry operation for restoring the read error with respect to the read data by varying read voltage level until the read operation with respect to the read data is accomplished within the range of fixed count.

As the read retry operation for restoring read error is performed frequently, a performance of the NAND flash memory and a performance of a memory system including the NAND flash memory may be degraded. Accordingly, a method for improving the performance of the NAND flash memory and the performance of the memory system including the NAND flash memory is desired.

SUMMARY

According to at least one example embodiment, a method for operating a memory controller includes programming a first real time clock (RTC) value indicating a time-of-day associated with a program operation, when the program operation for programming data to a storage region of the non-volatile memory is performed, the first RTC value being programmed into the non-volatile memory; obtaining information for the storage region by using the first RTC value read from the non-volatile memory and a second RTC value indicating a time-of-day when the read operation is performed, when the read operation for the data programmed to the storage region is performed; and controlling a maximum count of a read retry operation based on the obtained information, when the read retry operation is performed for the storage region.

According to at least one example embodiment, the method further comprises generating a booting RTC value indicating a booting time-of-day output from a host by using a counter when the memory controller is booted up, and generating the first RTC value and the second RTC value based on the booting RTC value and output values of the counter. The obtained information is obtained based on a difference between the second RTC value and the first RTC value.

According to at least one example embodiment, the method further includes generating the first RTC value by using a real time clock circuit and thereafter generating the second RTC value. Each of the first RTC value and the second RTC value is an updated value with respect to with respect to a booting RTC value indicating a booting time-of-day output from a host when the memory controller is booted up, the booting RTC value being updated by the real time clock circuit.

According to at least one example embodiment, the controlling includes decreasing the maximum number of iterations of the read retry operation. According to at least one example embodiment, the controlling includes transmitting a control signal for controlling an initial read voltage level used to perform the read retry operation to the non-volatile memory.

According to at least one example embodiment, a memory system includes a non-volatile memory including a storage region; and a memory controller configured to control an operation of the non-volatile memory. The memory controller is configured to determine a comparison value indicating a difference between a first time-of-day when a program operation for the storage region is performed and a second time-of-day when a read operation for the storage region is performed, and to control a read retry operation for the storage region based on the comparison value.

According to at least one example embodiment, the memory controller includes a real time clock (RTC) circuit configured to generate a first RTC value and a second RTC value in response to a clock signal, and a microprocessor configured to program the first RTC value indicating the first time-of-day into the non-volatile memory, determine the comparison value indicating difference between the first RTC value read from the non-volatile memory and the second RTC value indicating the second time-of-day when the read operation is performed, and configured to control the read retry operation based on the comparison value.

According to at least one example embodiment, the RTC circuit includes a counter configured to generate the first RTC value and the second RTC value in response to the clock signal.

According to at least one example embodiment, the microprocessor is configured to transmit a control signal for controlling an initial read voltage level which is used in to the read retry operation to the non-volatile memory. The memory system is a multi-chip package (MCP) including the non-volatile memory and the memory controller.

According to at least one example embodiment, the memory system further includes a card interface configured to transmit program data output from a host for executing the program operation to the memory controller and configured to transmit read data output from the memory controller as a result of the read retry operation to the host.

According to at least one example embodiment, the memory system further includes an image sensor configured to convert an optical image into a digital image, and the memory controller is configured to control at least one of the program operation and a read operation, the program operation including programming the digital image into the storage region, the read operation including reading the digital image stored in the storage region.

According to at least one example embodiment, the memory system further includes a radio transceiver, and the microprocessor is configured to control at least one of the program operation and a transmitting operation, the program operation including programming data output from the radio transceiver to the storage region, the transmitting operation including transmitting data read from the storage region based on the read retry operation to the radio transceiver.

According to at least one example embodiment, a memory controller for controlling a non-volatile memory may include a clock circuit configured to determine a first time value indicating a time at which a program operation is performed on one of a plurality of regions of the non-volatile memory and a second time value indicating a time at which a read operation is performed on the one of the plurality of regions of the non-volatile memory; and a processor configured to control the performance of a read retry operation on the non-volatile memory based on the first and second time values.

According to at least one example embodiment, the processor is configured to generate a comparison result based on the first and second time values, and to control the performance of the read retry operation based on the comparison result.

According to at least one example embodiment, the processor is configured to control the read retry operation by setting a maximum number of iterations of the read retry operation based on the comparison result.

According to at least one example embodiment, the processor is configured to control the read retry operation by setting a voltage level of an initial voltage used in the read retry operation based on the comparison result.

According to at least one example embodiment, the clock circuit is configured to generate the first and second time values by updating a boot-up time value, the boot-up time value indicating a time at which the non-volatile memory initially receives power during a boot-up of the non-volatile memory.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 5 is a table illustrating an example of a change of threshold voltage and a change of maximum count of read retry, according to the difference between a program time point and a read time point;

DETAILED DESCRIPTION OF THE EMBODIMENTS

Figure 1:
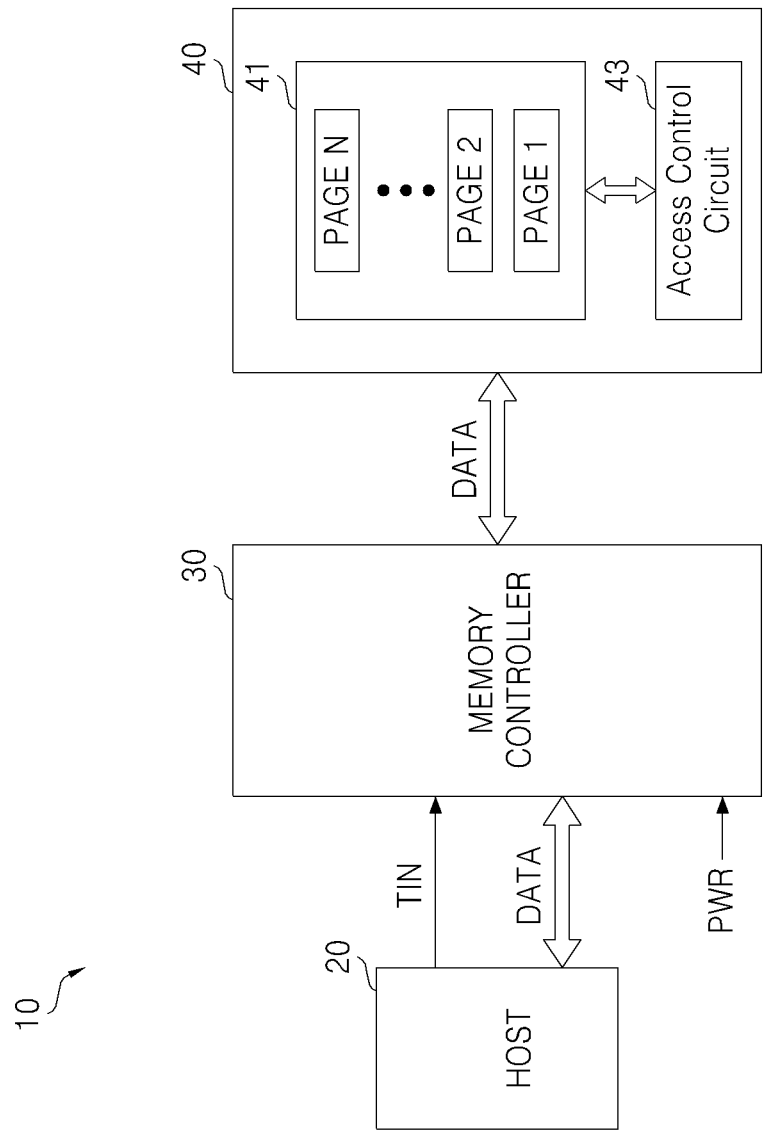
FIG. 1 is a block diagram of a memory system including a memory controller according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a memory system including a memory controller according to at least one example embodiment. Referring to FIG. 1, the memory system 10 includes a host 20, a memory controller 30 and a non-volatile memory device, for example, NAND flash memory 40. According to at least one example embodiment, the memory controller 30 and the NANND flash memory 40 may be packaged in a form of multi-chip package.

The host 20 may control the general operation of the memory controller 30. For example, the host 20 may transmit a program request for programming data to the NAND flash memory 40, a read request for reading data programmed to the NAND flash memory 40, or an erase request for erasing a specific block among a plurality of blocks included in the NAND flash memory 40 to the memory controller 30.

In addition, the host 20 may transmit booting information TIN indicating a booting time-of-day to the memory controller 30, when each element 20, 30, and 40 is provided with power and booted up. That is, the host 20 may transmit booting information TIN indicating a booting time-of-day to the memory controller 30 whenever the memory system 10 is booted up.

For example, the booting time-of-day may represent date/month/year and/or second/minute/hour.

The memory controller 30 may output a plurality of control signals and data DATA required to perform the program operation to the NAND flash memory 40 based on the program request output from the host 20, so that the program operation may be performed in the NAND flash memory 40

The memory controller 30 may transmit a plurality of control signals required to perform the read operation to the NAND flash memory 40 based on the read request output from the host 20, so that the read operation may be performed in the NAND flash memory 40.

In addition, the memory controller 30 may transmit a plurality of control signals required to perform the erase operation to the NAND flash memory 40 based on the erase request output from the host 20, so that the erase operation may be performed in the NAND flash memory 40.

The memory controller 30 may calculate the difference between a first time-of-day when the program operation is performed with respect to the storage region and a second time-of-day when the read operation is performed with respect to the storage region, and obtain information about the storage region based on the result of calculation.

Figure 2:
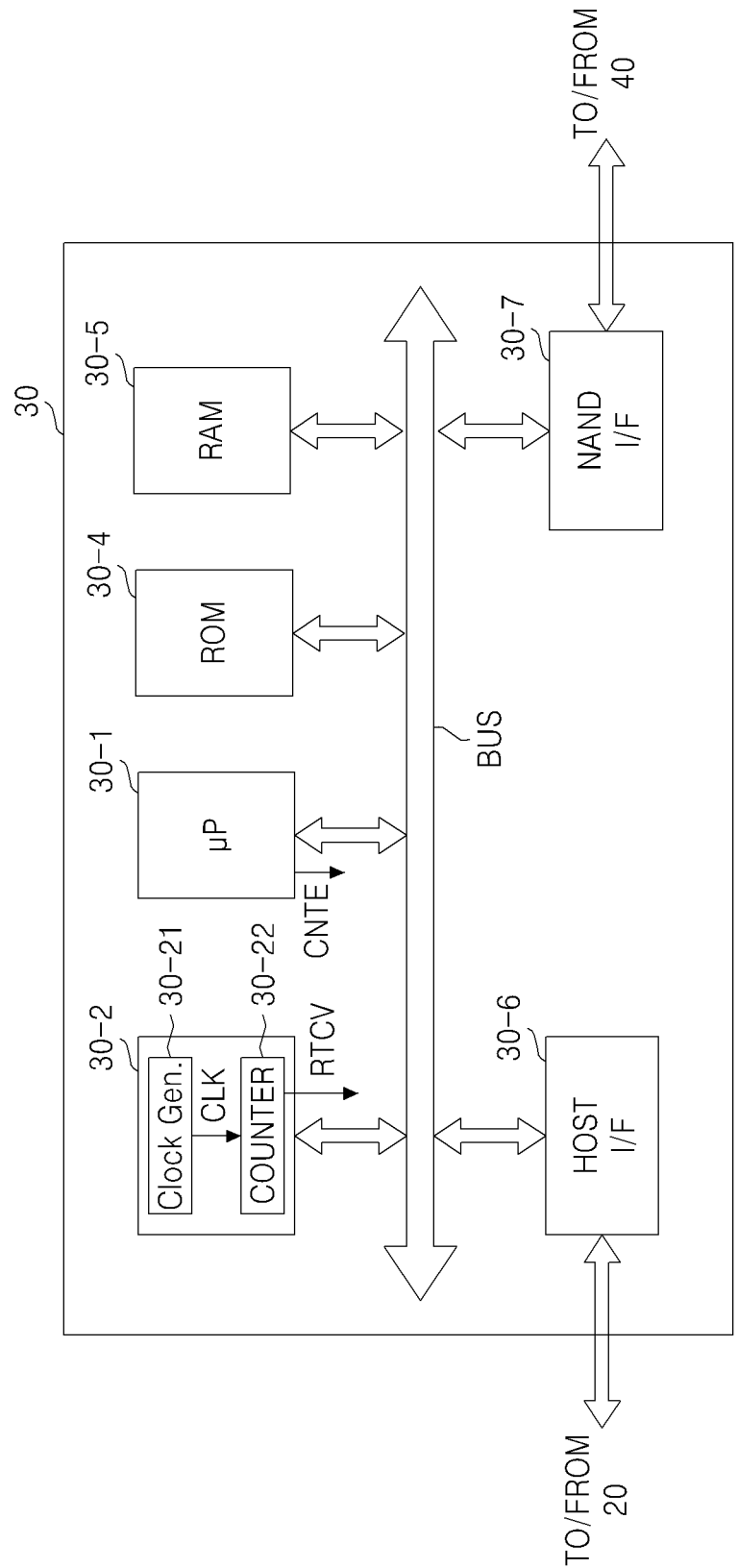
FIG. 2 is a block diagram of the memory controller shown in FIG. 1.

The first time-of-day and the second time-of-day may both be calculated by a real time clock circuit 30-2 shown in FIG. 2.

The memory controller 30 may control a maximum count of the read retry operation by using the information obtained about the storage region based on the result of calculation. In addition, the memory controller 30 may perform a wear leveling for a block or page included in the NAND flash memory 40 by using the obtained information.

The NAND flash memory 40 includes a memory cell array 41 and an access control circuit 43.

The memory cell array 41 for storing data DATA includes a plurality of blocks, each of the plurality of blocks includes a plurality of pages, each of the plurality of pages includes a plurality of word lines, a plurality of bit lines, and a plurality of NAND memory cells. Each of the NAND memory cells may be a single-level cell (SLC) for storing 1-bit or a multi-level cell for storing 2-bit or more.

FIG. 1 illustrates the memory cell array 41 including a block having a plurality of pages PAGE 1-PAGE N, for convenience of explanation.

The access control circuit 43 accesses the memory cell array 41 to perform the program operation programming a page data on a page (for example, PAGE 1), to perform the read operation reading data programmed on the PAGE 1, and to perform the erase operation erasing data programmed on a block.

The program operation and the read operation are performed in the unit of page and the erase operation is performed in the unit of block in the NAND flash memory 40.

FIG. 2 is a block diagram of a memory controller shown in FIG. 1. The memory controller 30 includes a microprocessor 30-1, a real time clock (RTC) circuit 30-2, a read only memory (ROM) 30-4, a random access memory (RAM) 30-5, a host interface 30-6, a NAND interface 30-7, and a bus BUS.

The microprocessor 30-1 denotes a circuit, logic, code and/or a combination thereof. The microprocessor 30-1 controls overall operations of the memory controller 20.

The RTC circuit 30-2 also referred to as a real time clock (RTC) may perform a function of a clock recording a time-of-day maintained during the memory controller 20 being provided with power, for example, a main power or a battery power, continuously. That is, the RTC circuit 30-2 always updates the present time-of-day in response to a clock signal (CLK) while provided with power.

The RTC circuit 30-2 includes a clock generator 30-21 generating a clock signal CLK and a counter 30-22 generating or storing a count value indicating a time-of-day based on the clock signal CLK, that is, an RTC value. For example, the RTC circuit 30-2 may generate or store the count value corresponding to 00000000h, that is, the RTC value when the present time-of-day is 0:00:00 AM, 1, Apr., 2011.

FIG. 2 illustrates the RTC circuit 30-2 including the clock generator 30-21 and the counter 30-22, but the counter 30-22 may be designed at the outside of the RTC circuit 30-2 in some embodiment.

The microprocessor 30-1 may obtain information about the storage region by using the RTC value indicating a time-of-day when the program operation is performed (for example, 7:00:00 PM, 1, Apr., 2011) and the RTC value indicating a time-of-day when the read operation is performed (for example, 09:30:00 AM, 25, Jul., 2011), when the program operation and the read operation are performed for the storage region PAGE 1 at intervals.

The ROM 30-4 may store a program code required to the operation of the memory controller 30. Also, the table shown in FIG. 5 may be stored to the ROM 30-4.

The RAM 30-5 may execute a function as an operation memory of the microprocessor 30-1. Accordingly, a program code related to the booting which is output from the ROM 30-4 and/or the table of FIG. 5 may be loaded to the RAM 30-5, when the memory controller 30 is booted up.

The host interface 30-6 may perform interfacing control signals and/or data exchanged between the host 20 and the memory controller 30. The NAND interface 30-7 may perform interfacing control signals and/or data exchanged between the memory controller 30 and the NAND flash memory 40.

Each of the elements 30-1, 30-2, 30-4, 30-5, 30-6, and 30-7 may communicate with each other through the bus BUS.

Figure 3:
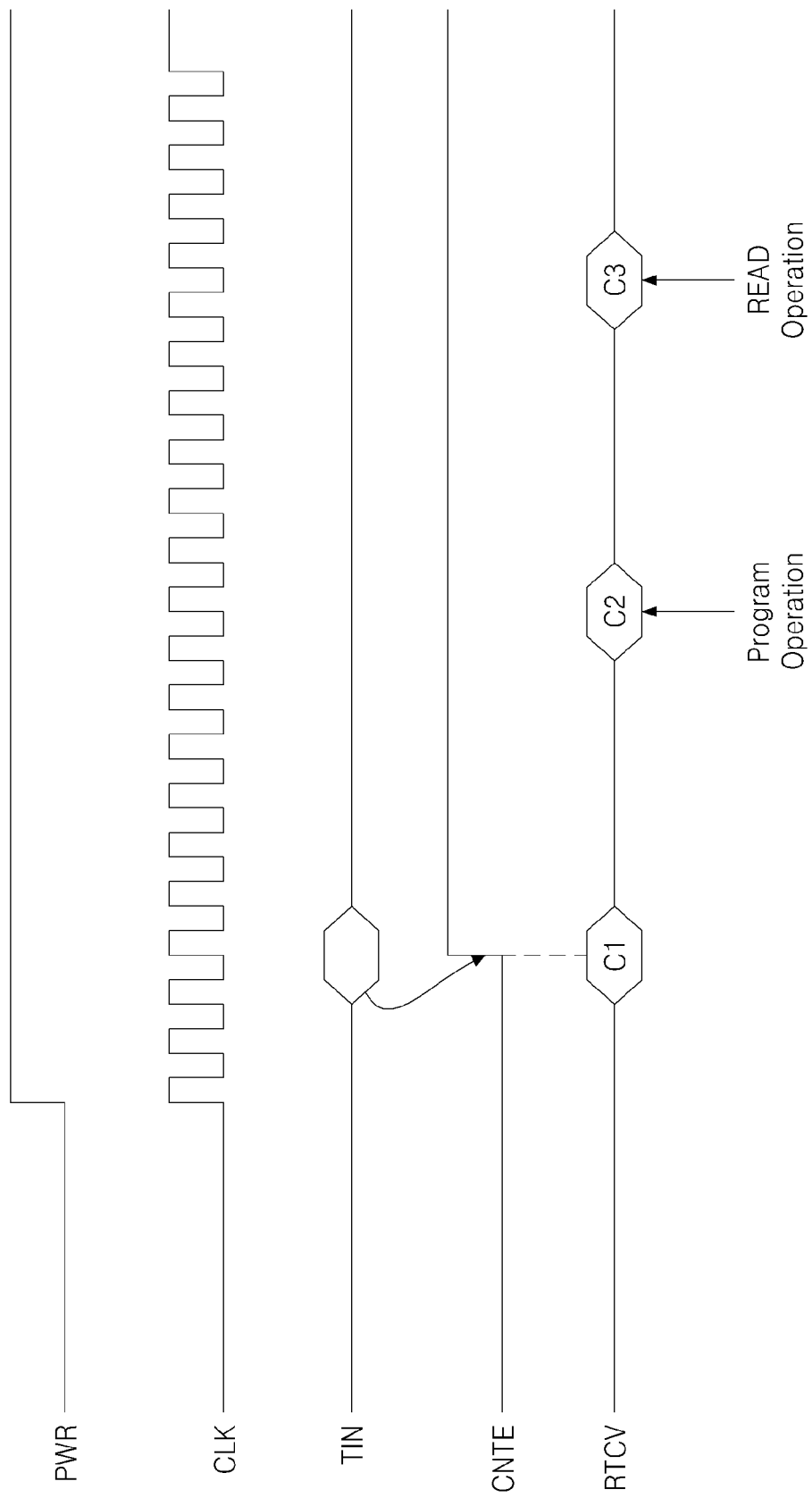
FIG. 3 is a signal waveform to explain an operation of a real time clock circuit shown in FIG. 2.

FIG. 3 is a signal waveform for explaining operations of the real time clock circuit shown in FIG. 2. Referring to FIG. 1 through FIG. 3, when each, or, alternatively, one or more, of the elements 20, 30, and 40 is provided with power PWR, the clock generator 30-21 of the RTC circuit 30-2 generates a clock signal CLK.

When the memory system 10 is booted up, the host 20 transmits the booting time-of-day information TIN to the memory controller 30.

The microprocessor 30-1 may generate a counter enable signal CNTE to enable the counter 30-22 in response to the booting time-of-day information TIN, the counter 30-22 may generate or store a count value RTCV, that is, an initial RTC value C1, corresponding to a booting time-of-day in response to a counter enable signal CNTE.

According to another exemplary embodiment, the counter 30-22 of the RTC circuit 30-2 may generate or store a count value RTCV, that is, an initial RTC value C1, corresponding to a booting time-of-day based on the booting time-of-day information TIN input through the host interface 30-6.

The counter 30-22 may generate or store a count value RTCV, that is, RTC value, increased or up-dated from an initial RTC value C1 continuously, in response to a clock signal CLK output from the clock generator 20-21.

For example, the RTC circuit 30-2 may generate or store a first RTC value C2 indicating a time-of-day when the program operation is performed and a second RTC value C3 indicating a time-of-day when the read operation is performed according to a clock signal CLK, respectively.

Figure 4:
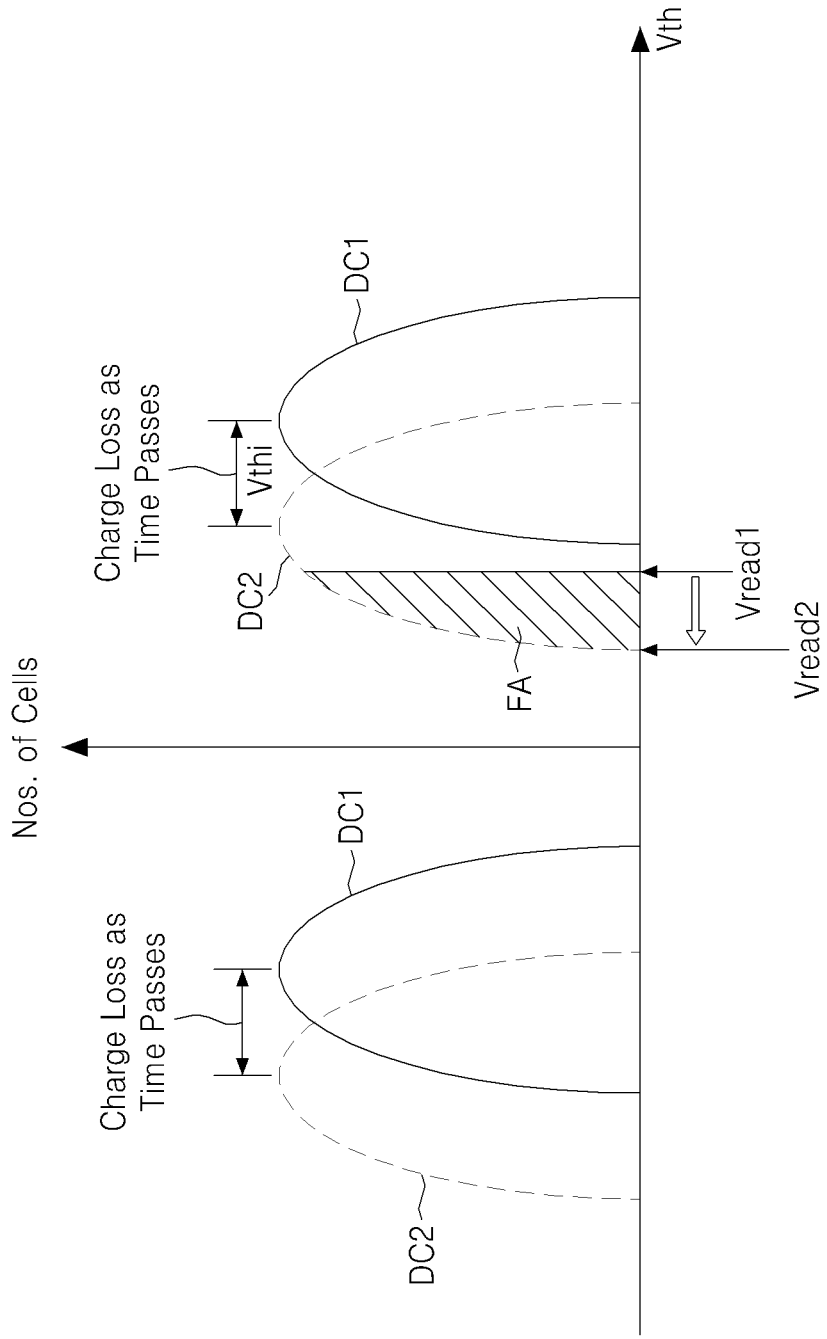
FIG. 4 illustrates distribution of threshold voltages of non-volatile memory cells according to the charge loss as time passes.

FIG. 4 is a distribution of threshold voltage of non-volatile memory cells which is caused by charge loss that occurs as time passes. Referring to FIG. 4, the horizontal axis represents threshold voltage, the vertical axis represents the number of NAND memory cells, DC1 represents the distribution of the NAND memory cells at program operating, and DC2 represents the distribution of the NAND memory cells, which is shifted along with the charge loss occurred as time passes.

A first initial read voltage Vread1 and a second read voltage Vread2 represents a read voltage level used to perform a read operation and an initial read voltage level used to perform a read retry operation, respectively. At this time, Vread2<Vread1.

FA represents the distribution of the NAND memory cells that may have a read error, when the read operation or the read retry operation is performed with the first initial read voltage Vread1.

FIG. 5 is a table illustrating examples of changes of threshold voltage and changes of a maximum count of the read retry operation, according to the difference between a program time-of-day and a read time-of-day. The table shows a change of threshold voltage Vthi according to the difference Di (i is a natural number, 1≤i≤n) between a second RTC value C3 which indicates a time-of-day when the read operation is performed and a first RTC value C2 which indicates a time-of-day when the program operation is performed.

That is, the longer time passes after data programmed in the NAND memory cell, the more charge loss occurs as time passes, therefore, a change of threshold Vthi becomes greater. Accordingly, the memory controller 30 may decrease a maximum count of the read retry operation within the range that a read error may not occur as time passes after data programmed.

For example, during the read operation or read retry operation, the memory controller 30 may set the maximum count of the read retry operation as R1 reflecting a first change (Vth1) at the first difference D1, the maximum count of the read retry operation as R2 (R2<R1) reflecting a second change (Vth2>Vth1) at the second difference D2 (D2>D1), and the maximum count of the read retry operation as R3 (R3<R2) reflecting a third change (Vth3>Vth2) at the third difference (D3>D2).

Thus, the memory controller 30 may have an effect of calculating the time interval by using the real time clock circuit 30-2 when the program operation and the read operation are performed with respect to an identical storage region at intervals, and decreasing a maximum count of the read retry operation with respect to the storage region based on the result of calculation. Accordingly, the read performance of the memory system 10 including the memory controller 30 may be increased.

According to at least one example embodiment, a maximum count of the read retry operation may be decreased according to the result of a calculation. Additionally, according to at least one example embodiment, the result of calculation may be also used as an index for evaluating reliability of the NAND flash memory, for example, endurance and/or data retention.

The endurance is an index related to a program/erase cycle (P/E cycle), and the data retention is an index describing a characteristic regarding, for example, a period of time data stored to the NAND memory cell is retained.

Figure 6:
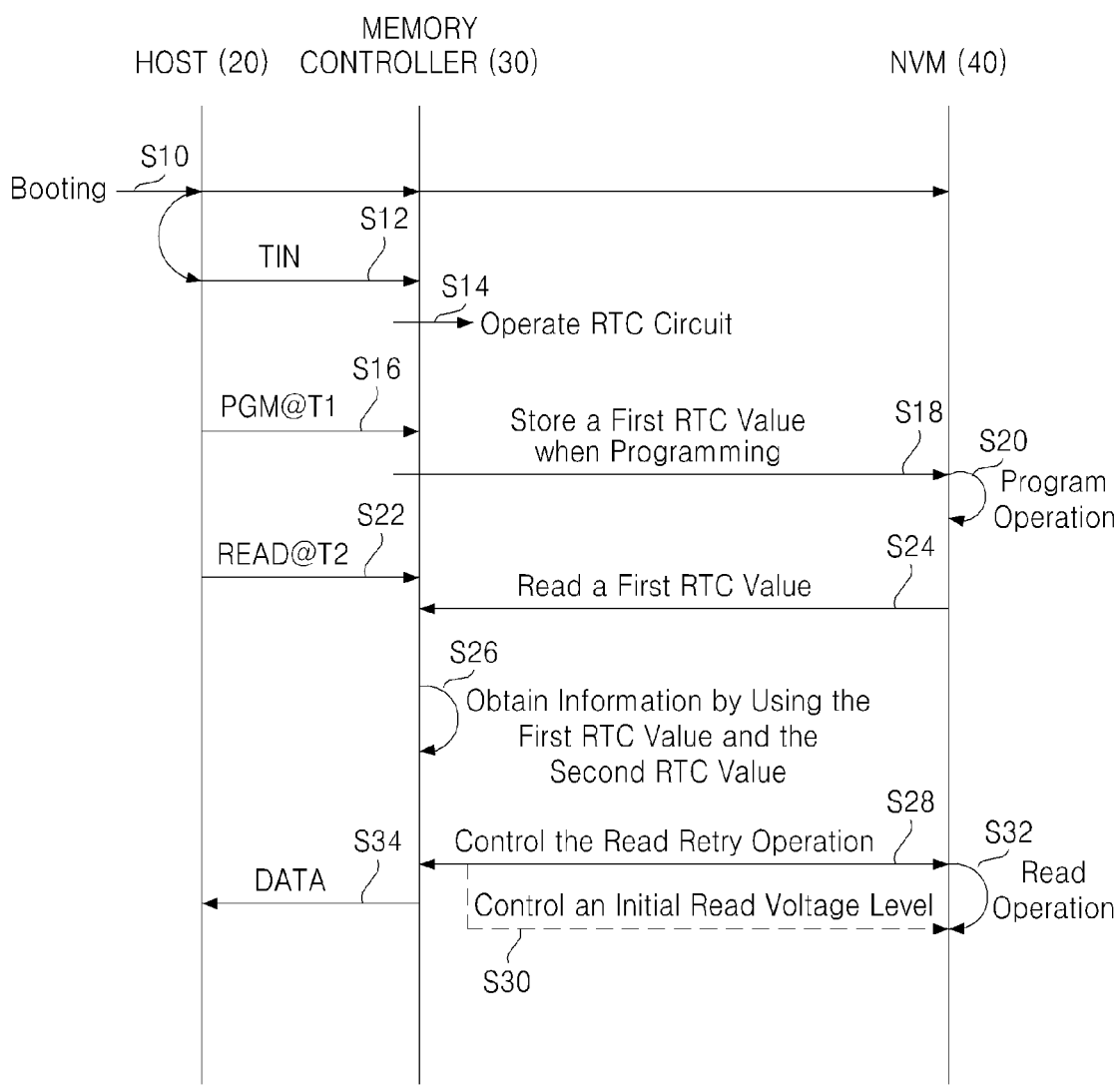
FIG. 6 is a signal flowchart to explain an operation of the memory system shown in FIG. 1.

FIG. 6 is a signal flowchart for explaining operations of the memory system shown in FIG. 1. The operation of the memory system 10 is explained in detail referring to FIG. 1 through FIG. 6.

When the memory system 10 is booted as each of the elements 20,30,40 is provided with power, the host 20 transmits booting time-of-day information TIN indicating a booting time-of-day to the memory controller 30 (S12).

The RTC circuit 30-2 of the memory controller 30 generates an initial RTC value C1 based on the booting time-of-day information TIN (S14). The RTC circuit 30-2 updates the initial RTC value C1 in response to a clock signal CLK while the clock signal CLK is provided thereto.

A program request PGM for programming data to a storage region (for example, a first page PAGE1) of the NAND flash memory 40 is output from the host 20 at T1 time point (S16).

After the program request PGM is output from the host 20, the memory controller 30 transmits a program command for programming the data to the storage region PAGE 1 and the data to the NAND flash memory 40, according to the program request PGM. At this time, the microprocessor 30-1 controls the determination of a first RTC value C2, and the transmission of the first RTC value C2 to the NAND flash memory 40 for storing the first RTC value C2 indicating the time-of-day when the program operation is performed in the meta region of the NAND flash memory 40 under the program command (S18). At this time, the first RTC value C2 is the value generated by the RTC circuit 30-2, that is, the updated value from the initial RTC value C1.

The NAND flash memory 40 performs the operation for programming the data to the storage region PAGE 1 and the operation for programming the first RTC value C2 to the meta region related to the storage region PAGE 1 (S20).

When a read request READ for reading the data programmed to the storage region PAGE 1 of the NAND flash memory 40 is output from the host 20 at T2 time point (S22), the microprocessor 30-1 of the memory controller 30 reads the first RTC value C2 programmed to the meta region according to the read request READ, and may also determine a second RTC value C3 indicating the time-of-day when the read operation is performed (S24).

The memory system 10 may be booted up at least one time between T1 time point and T2 time point. Also, in case that the memory system 10 is implemented as a server, power may be provided to the memory system 10 continuously.

The microprocessor 30-1 may obtain information about the storage region PAGE 1 by using the second RTC value C3 indicating the time-of-day when the read operation is performed and the first RTC value C2 indicating the time-of-day when the program operation is performed (S26).

The microprocessor 30-1 may control the maximum count of the read retry operation by using the information when the read retry operation is performed with respect to the storage region PAGE 1 (S28).

That is, the microprocessor 30-1 may perform the read retry operation until a read error may not occur, within the decreased maximum count of the read retry operation. For instance, if the difference between the second RTC value C3 and the first RTC value C2 is D2, the microprocessor 30-1 controls the operation of the NAND flash memory 40 within R2 such that the read retry operation may be performed, and if the difference between the second RTC value C3 and the first RTC value C2 is Dn, the microprocessor 30-1 controls the operation of the NAND flash memory 40 within Rn (Rn<R1) such that the read retry operation may be performed.

At this time, the microprocessor 30-1 may transmit a control signal for controlling an initial read voltage level required to the read retry operation to the non-volatile memory 40 according to the information obtained in step S26 (S30).

As shown in FIG. 4, the NAND flash memory 40 may change the initial read voltage level from the first read voltage level Vread1 to the second initial read voltage level Vread2 based on the control signal.

Accordingly, the NAND flash memory 40 may perform the read operation or the read retry operation by using the second initial read voltage level Vread2 (S32). For example, the NAND flash memory 40 may perform the read retry operation as decreasing the read voltage level from the second initial read voltage level Vread2 until a read error may not occur within the maximum count of the read retry operation.

The memory controller 30 transmits the error corrected data DATA based on the read operation or the read retry operation to the host 20 (S34).

Figure 7:
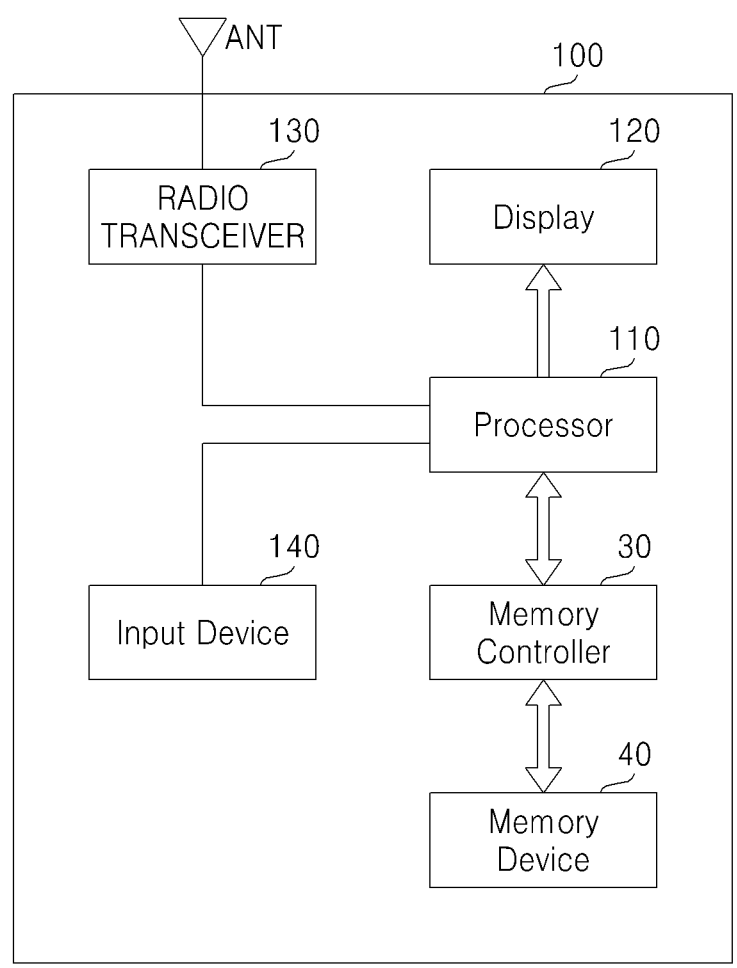
FIG. 7 is an exemplary embodiment of an electronic device including the memory system shown in FIG. 1.

FIG. 7 illustrates an exemplary embodiment of an electronic device including the memory system shown in FIG. 1. Referring to FIG. 1 through FIG. 7, the electronic device 100 may be embodied as cellular phone, smart phone, tablet personal computer (PC), personal digital assistant (PDA), portable multi-media player (PMP) or radio communication device.

The electronic device 100 includes the non-volatile memory 40, the memory controller 30 capable of controlling the non-volatile memory 40, and a processor 110 performing the function of the host 20 of FIG. 1.

The memory controller 30 may control the data access operation, for example, program operation, erase operation, or read operation, under the control of the processor 110.

The data programmed to the non-volatile memory 40 may be displayed through a display 120 under the control of the processor 110 and/or the memory controller 30.

A radio frequency (RF) transceiver 130 may exchange a radio signal through an antenna ANT. For example, the radio frequency transceiver 130 may convert a radio signal received from the antenna ANT into a signal may be processed in the processor 110.

Thus, the processor 110 may process a signal output from the radio frequency transceiver 130 and transmit the processed signal to the memory controller 30 or the display 120. The memory controller 30 may program the signal processed by the processor 110 to the non-volatile memory 40.

The radio frequency transceiver 130 may convert a signal output from the processor 110 into a radio signal and output the converted radio signal into an external device through the antenna ANT. For example, the microprocessor 30-1 of the memory controller 30 may control the transmission of data read from the storage region PAGE 1 to the radio frequency transceiver 130 according to the program operation programming data output from the radio frequency transceiver 130 to the storage region PAGE 1 of the non-volatile memory 40 or the read retry operation.

An input device 140 is a device for inputting data to be processed by a control signal for controlling the operation of the processor 110 or the processor 110, and may be embodied into a pointing or gesturing device such as touch pad and computer mouse, a key pad, or a key board.

The processor 110 may control the operation of the display 120 such that a data output from the radio frequency transceiver 130 or a data output from the input device 140 may be displayed through the display 120.

The memory controller 30 capable of controlling the operation of the non-volatile memory 40 may be implanted as a part of the processor 110 and also as a separated chip from the processor 110 according to an exemplary embodiment.

Figure 8:
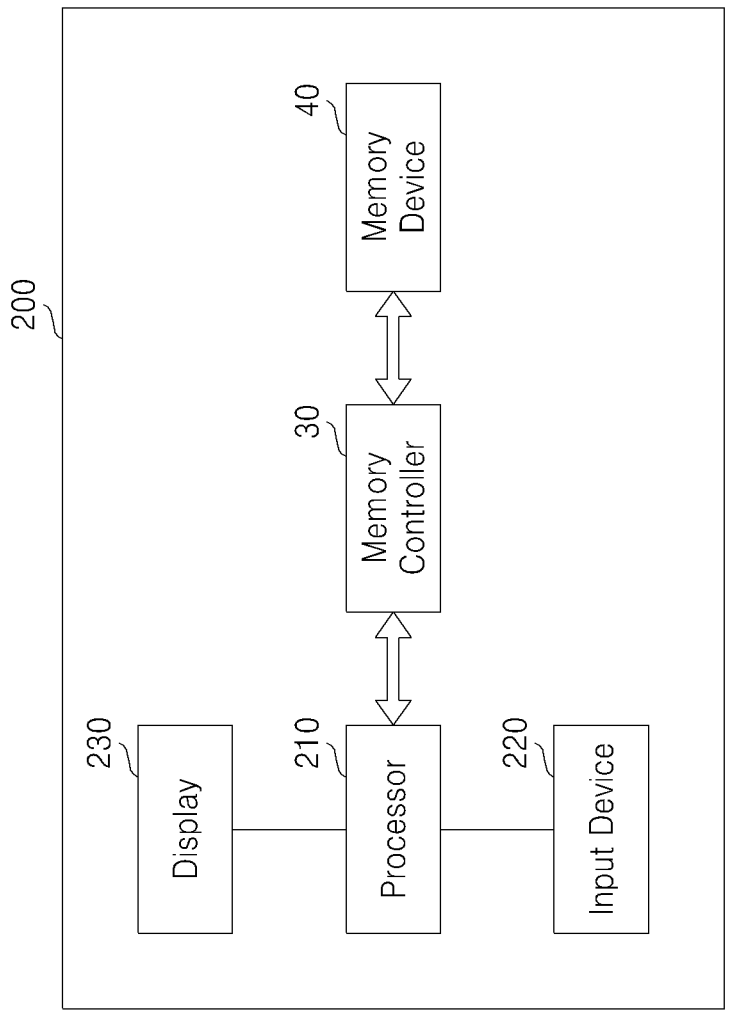
FIG. 8 is another exemplary embodiment of an electronic device including the memory system shown in FIG. 1.

FIG. 8 illustrates another exemplary embodiment of an electronic device including the memory system shown in FIG. 1. The electronic device 200 shown in FIG. 8 may be embodied as personal computer (PC), tablet PC, net-book, e-reader, PDA, PMP, MP3 player, or MP4 player.

The electronic device 200 includes a processor 210 performing the function of the memory controller 30 controlling the operation of the non-volatile memory device 40 and the host 20 described above with reference to FIG. 1.

The processor 210 may display a data stored to the non-volatile memory 40 according to a data input through an input device 220 through a display 230. For example, the input device 220 may be embodied as a pointing or gesturing device such as touch pad or computer mouse, a key pad, or a key board.

The processor 210 may control the general operation of the memory system 200 and the operation of the memory controller 30. The memory controller 30 capable of controlling the operation of the non-volatile memory 40 may be implemented as a part of processor 210 and also as a separated chip from the processor 210, according to an exemplary embodiment.

For example, the microprocessor 30-1 of the memory controller 30 may control to transmit data read from the storage region PAGE 1 according to the program operation programming data output from the input device 220 or the processor 210 to the storage region PAGE 1 of the non-volatile memory 40 to the display 230 or the processor 210.

Figure 9:
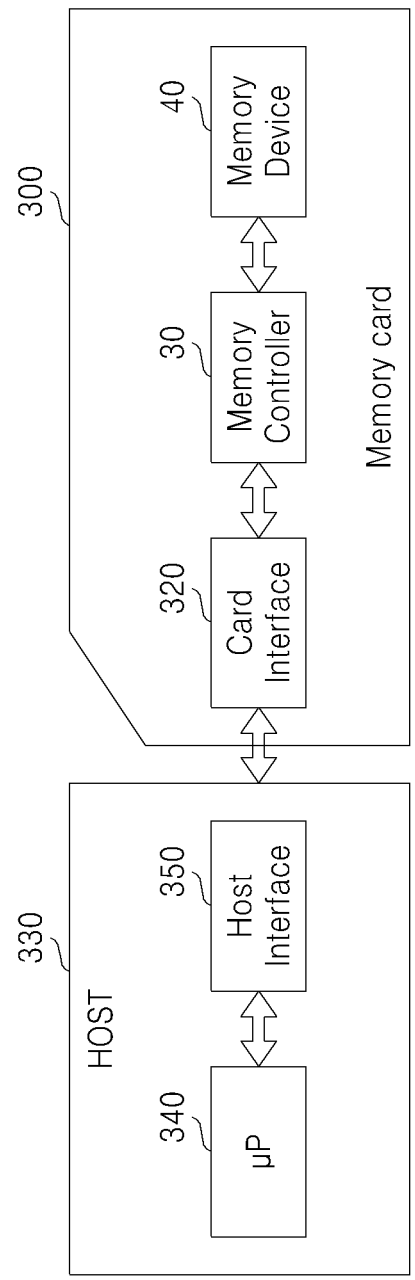
FIG. 9 is yet another exemplary embodiment of an electronic device including the memory system shown in FIG. 1.

FIG. 9 illustrates yet another exemplary embodiment of an electronic device including the memory system shown in FIG. 1. The electronic device 300 illustrated in FIG. 9 may be embodied as memory card or smart card. The electronic device 300 includes the non-volatile memory 40, the memory controller 30, and a card interface 320.

The memory controller 30 may control data communication between the memory device 40 and the card interface 320. According to an exemplary embodiment, the card interface 320 may be a secure digital (SD) card interface or multi-media card (MMC) interface, but the embodiment is not restricted thereto.

The card interface 320 may interface data communication between a host 330 and the memory controller 30 under a protocol of the host 330. The host 330 may have the same structure and operation as that described above with reference to the host 20 of FIG. 1.

The card interface 320 transmits a program data output from the host 330 to the memory controller 30 to perform the program operation and a read data output from the memory controller 30 according to the read retry operation to the host 330.

The card interface 320 may support a Universal Serial Bus (USB) protocol and InterChip (IC)-USB protocol according to an exemplary embodiment. Here, the card interface may denote hardware capable of supporting a protocol that the host 330 uses, software embedded on the hardware, or a method of signal transmitting.

When the electronic device 300 is connected to a host interface 350 of the host 330, such as PC, tablet PC, digital camera, digital audio player, mobile phone, consol video game hardware, or digital set-top box, the host interface 350 may perform data communication with the non-volatile memory 40 through the card interface 320 and the memory controller 30 under the control of the microprocessor 340.

Figure 10:
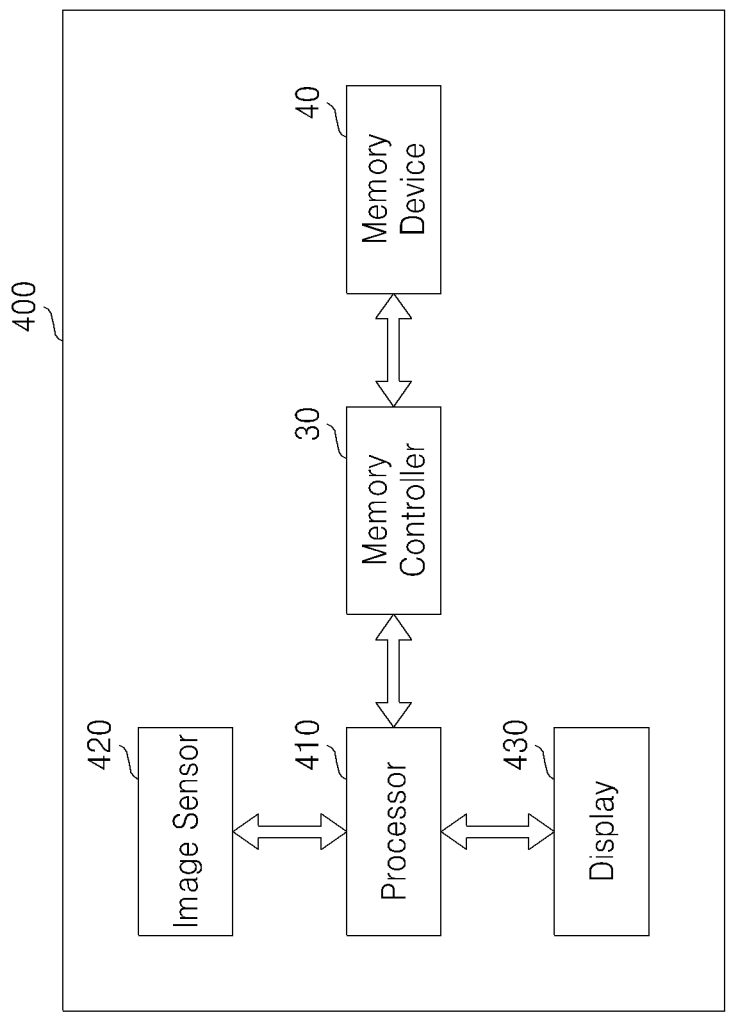
FIG. 10 is yet another exemplary embodiment of an electronic device including the memory system shown in FIG. 1.

FIG. 10 illustrates yet another exemplary embodiment of an electronic device including the memory system of FIG. 1. The electronic device 400 shown in FIG. 10 may be embodied as an image processing device, for example, digital camera, mobile phone with camera mounted, smart phone with camera mounted, or tablet PC with camera mounted.

The electronic device 400 includes the non-volatile memory 40; the memory controller 30 controlling a data processing operation, for example, program operation, erase operation, or read operation; and a processor 410 that performs the function of the host 20 described above with reference to FIG. 1.

An image sensor 420 of the electronic device 400 converts an optical image into a digital image, and the converted digital image is transmitted to the processor 410 or the memory controller 30. The converted digital image may be displayed through a display 430 or stored in the non-volatile memory 40 through the memory controller 30 under the control of the processor 410. Also, a data stored in the non-volatile memory 40 may be displayed through the display 430 under the control of the processor 410 or the memory controller 30.

The memory controller 30 controlling the operation of the non-volatile memory 40 may be implemented as a part of the processor 410 and also as a separated chip from the processor 410 according to an exemplary embodiment.

For example, the memory controller 30 may control the program operation programming a digital image output from the image sensor 420 to a storage region PAGE 1 of the non-volatile memory 40 or the read operation reading a digital image stored in the storage region PAGE 1.

Figure 11:
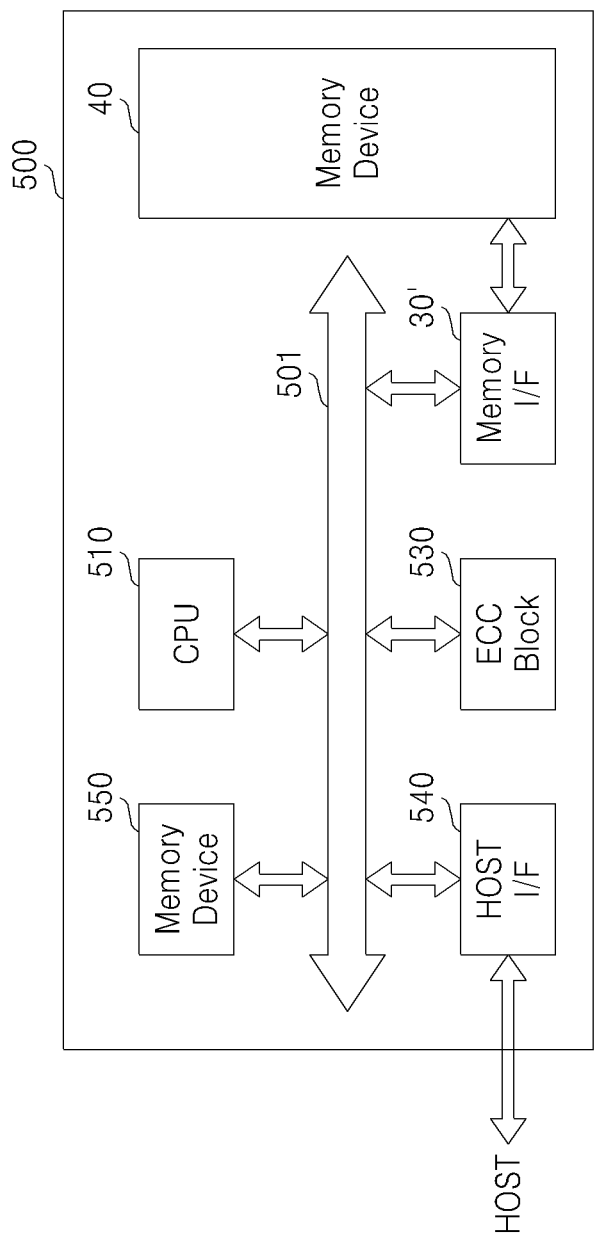
FIG. 11 is yet another exemplary embodiment of an electronic device including the memory system shown in FIG. 1.

FIG. 11 illustrates yet another exemplary embodiment of an electronic device including the memory system of FIG. 1. Referring to FIG. 11, the electronic device 500 includes a central processing unit (CPU) 510 controlling a non-volatile memory 40 and the operation of the non-volatile memory 40.

The electronic device 500 includes a memory device 550 may be used as an operation memory of the CPU 510. The memory device 550 may be embodied as a non-volatile memory such as read only memory (ROM) and as a volatile memory such as static random access memory (SRAM).

A host HOST connected to the electronic device 500 may perform data communication with the non-volatile memory 40 through the host interface 540. The host HOST may perform the functions describe above with reference to the host 20 of FIG. 1.

An error correction code (ECC) block 530 detects an error bit included in the data output from the non-volatile memory 40 through a memory interface 30', corrects the error bit, and transmits the error corrected data to the HOST through a host interface 540 under the control of the CPU 510.

The CPU 510 may control data communication between the memory interface 30', the ECC block 530, the host interface 540, and the memory device 550. At this time, the memory interface 30' may have the same structure and operation as that described above with reference to the memory controller 30 of FIGS. 1 and 2.

The electronic device 500 may be embodied as flash memory drive, USB memory drive, IC-USB memory drive, or memory stick.

Figure 12:
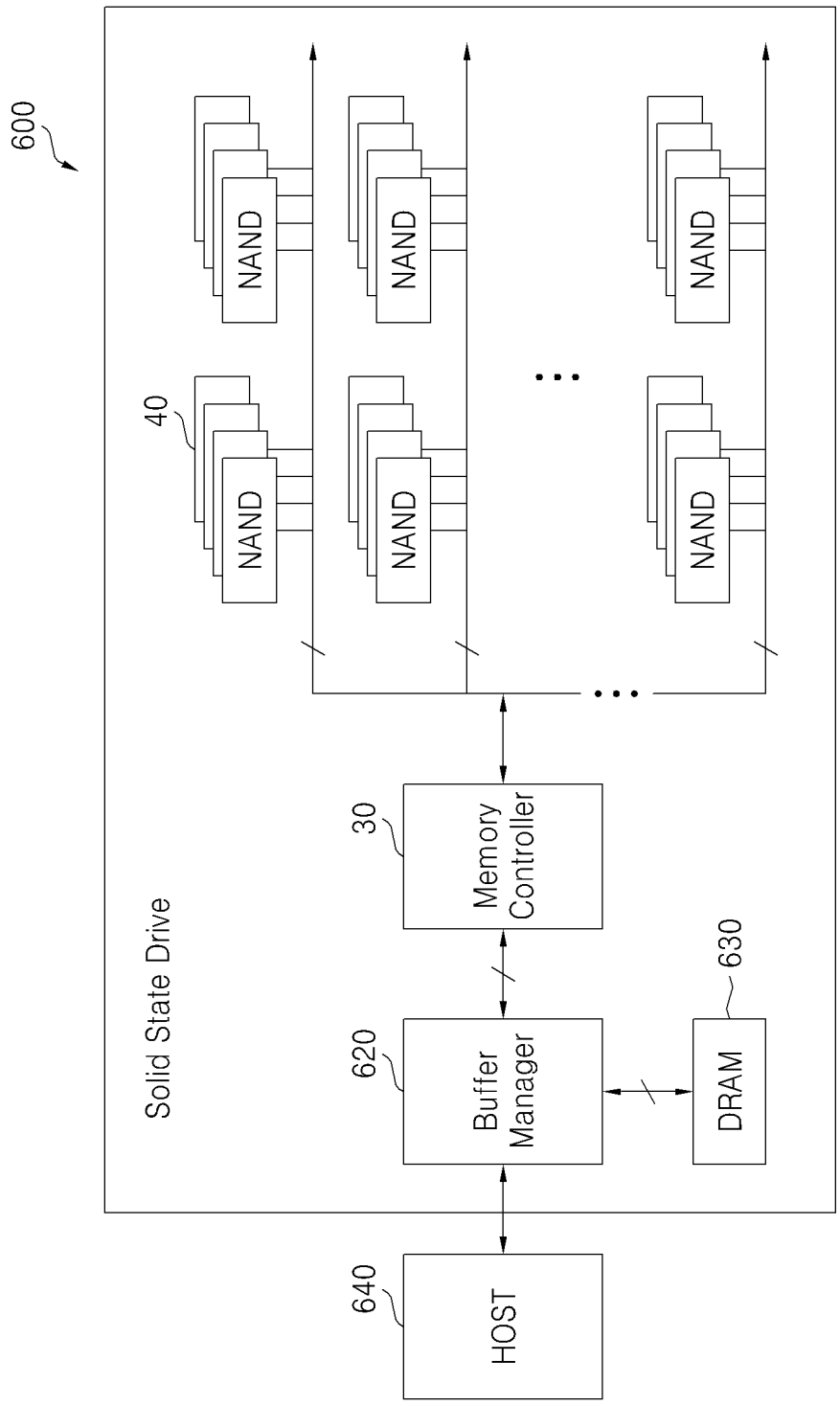
FIG. 12 is still yet another exemplary embodiment of an electronic device including the memory system shown in FIG. 1.

FIG. 12 illustrates still yet another exemplary embodiment of an electronic device including the memory system of FIG. 1. Referring to FIG. 12, the electronic device 600 may be embodied as a data processing device such as solid state drive (SSD).

The electronic device 600 includes a plurality non-volatile memories each of which may have the same structure and operation as that described above with reference to the non-volatile memory 40, the memory controller 30 controlling the data processing operation of each of the plurality of non-volatile memories 40, a volatile memory device 630 such as DRAM, and a buffer manager 620 controlling the storage of data exchanged between the memory controller 30 and a host 640 to the volatile memory device 630. The host 640 may have the same structure and operation as that described above with reference to the host 20 of FIG. 1. Each of the non-volatile memories 40 may be embodied as a NAND flash memory.

Figure 13:
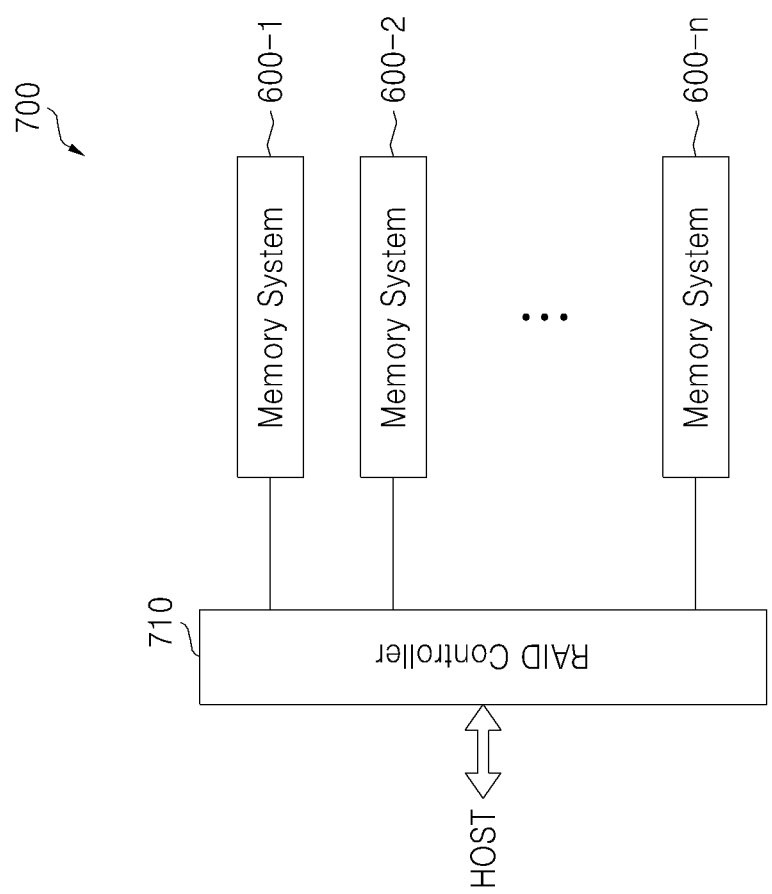
FIG. 13 is an exemplary embodiment of a data processing system including the electronic device shown in FIG. 12.

FIG. 13 illustrates an exemplary embodiment of a data processing system including the electronic device of FIG. 12. Referring to FIGS. 12 and 13, the data processing system 700 may be embodied as a redundant array of independent disks (RAID) system and includes an RAID controller 710 and a plurality of electronic devices 600-1600-$n$ (n is a natural number).

Each of the electronic devices 600-1-600-$n$ may be the electronic device 600 shown in FIG. 12, for example, a memory system. The electronic devices 600-1-600-$n$ may form an RAID array. The data processing system 700 may be embodied as, for example, a personal computer (PC) or a solid state drive (SSD).

The RAID controller 710 may output a program data output from a host HOST to at least one electronic device among the electronic devices 600-1-600-$n$ according to an RAID level under the program command output from the host HOST during the program operation. The RAID controller 710 may transmit a data read from at least one electronic device among the electronic devices 600-1~600-$n$ to the host HOST.

The method for operating a memory controller according to at least one example embodiment has an effect of decreasing a maximum count of the read retry operation with respect to the storage region according to the interval between the program operation and the read operation calculated by using the real time clock circuit, when the program operation and the read operation are performed with respect to the same storage region at intervals. Thus, the read performance of the memory system including the memory controller is increased.

Also, the method for controlling a memory controller performs a wear leveling effectively to calculate the interval by using the real time clock circuit and to extend the lifespan of the non-volatile memory according to the result of calculation.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method for operating a memory controller comprising:
   programming a first real time clock (RTC) value indicating a time-of-day associated with a program operation, when the program operation for programming data to a storage region of a non-volatile memory is performed, the first RTC value being programmed into the non-volatile memory;
   obtaining information for the storage region based on the programmed first RTC value and a second RTC value indicating a time-of-day when a read operation is performed, when the read operation for the data programmed to the storage region is performed; and
   controlling a read retry operation based on the obtained information, when the read retry operation is performed for the storage region.

2. The method of claim 1, further comprising:
   generating a booting RTC value indicating a booting time-of-day output from a host by using a counter, when the memory controller is booted up; and
   generating the first RTC value and the second RTC value based on the booting RTC value and output values of the counter.

3. The method of claim 1, wherein the obtained information is obtained based on a difference between the second RTC value and the first RTC value.

4. The method of claim 1, further comprising:
   generating the second RTC value after generating the first RTC value by using a real time clock circuit.

5. The method of claim 4, wherein each of the first RTC value and the second RTC value is an updated value with respect to a booting RTC value indicating a booting time-of-day output from a host when the memory controller is booted up, the booting RTC value being updated by the real time clock circuit.

6. The method of claim 1, wherein the controlling includes decreasing a maximum number of iterations of the read retry operation.

7. The method of claim 1, wherein the controlling includes transmitting a control signal for controlling an initial read voltage level used to perform the read retry operation to the non-volatile memory.

8. A memory system comprising:
   a non-volatile memory including a storage region; and
   a memory controller configured to control an operation of the non-volatile memory, the memory controller configured to determine a comparison value indicating a difference between a first time-of-day when a program operation for the storage region is performed and a second time-of-day when a read operation for the storage region is performed, and to control a read retry operation for the storage region based on the comparison value.

9. The memory system of claim 8, wherein the memory controller comprises:
   a real time clock (RTC) circuit configured to generate a first RTC value and a second RTC value in response to a clock signal; and
   a microprocessor configured to program the first RTC value indicating the first time-of-day into the non-volatile memory, determine the comparison value indicating the difference between the first RTC value read from the non-volatile memory and the second RTC value indicating the second time-of-day, when the read operation is performed, and configured to control the read retry operation based on the comparison, value.

10. The memory system of claim 9, wherein the RTC circuit includes a counter configured to generate the first RTC value and the second RTC value in response to the clock signal.

11. The memory system of claim 9, wherein the microprocessor is configured to transmit a control signal for controlling an initial read voltage level used in the read retry operation to the non-volatile memory.

12. The memory system of claim 9, wherein the memory system is a multi-chip package (MCP) including the non-volatile memory and the memory controller.

13. The memory system of claim 9, wherein the memory system further comprises:
   a card interface configured to transmit program data output from a host for executing the program operation to the memory controller, and configured to transmit read data output from the memory controller as a result of the read retry operation to the host.

14. The memory system of claim 9, wherein the memory system further comprises:
   an image sensor configured to convert an optical image to a digital image,
   wherein, the memory controller is configured to control at least one of the program operation and a read operation, the program operation including programming the digital image into the storage region, the read operation including reading the digital image stored in the storage region.

15. The memory system of claim 9, wherein the memory system further comprises:
   a radio transceiver,
   wherein the microprocessor is configured to control at least one of the program operation and a transmitting operation, the program operation including programming data output from the radio transceiver to the storage region, the transmitting operation including transmitting data read from the storage region based on the read retry operation to the radio transceiver.

16. A memory controller for controlling a non-volatile memory, the memory controller comprising:
   a clock circuit configured to determine a first time value indicating a time at which a program operation is performed on one of a plurality of regions of the non-volatile memory and a second time value indicating a time at which a read operation is performed on the one of the plurality of regions of the non-volatile memory; and
   a processor configured to control the performance of a read retry operation on the non-volatile memory based on the first and second time values.

17. The memory controller of claim 16, wherein the processor is configured to generate a comparison result based on the first and second time values, and to control the performance of the read retry operation based on the comparison result.

18. The memory controller of claim 17, wherein the processor is configured to control the read retry operation by setting a maximum number of iterations of the read retry operation based on the comparison result.

19. The memory controller of claim 17, wherein the processor is configured to control the read retry operation by setting a voltage level of an initial voltage used in the read retry operation based on the comparison result.

20. The memory controller of claim 16, wherein the clock circuit is configured to generate the first and second time values by updating a boot-up time value, the boot-up time value indicating a time at which the non-volatile memory initially receives power during a boot-up of the non-volatile memory.

* * * * *